(12) United States Patent
Yu

(10) Patent No.: US 11,853,680 B2
(45) Date of Patent: Dec. 26, 2023

(54) INCREMENTAL ROUTING BASED PIN ASSIGNMENT

(71) Applicant: Synopsys, Inc., Mountain View, CA (US)

(72) Inventor: Zhengtao Yu, Cary, NC (US)

(73) Assignee: Synopsys, Inc., Sunnyvale, CA (US)

( * ) Notice: Subject to any disclaimer, the term of this patent is extended or adjusted under 35 U.S.C. 154(b) by 119 days.

(21) Appl. No.: 17/367,015

(22) Filed: Jul. 2, 2021

(65) Prior Publication Data

US 2022/0004693 A1 Jan. 6, 2022

Related U.S. Application Data

(60) Provisional application No. 63/048,468, filed on Jul. 6, 2020.

(51) Int. Cl.
*G06F 30/00* (2020.01)
*G06F 30/394* (2020.01)
*G06F 30/392* (2020.01)
*G06F 30/3953* (2020.01)
*G06F 30/39* (2020.01)
(Continued)

(52) U.S. Cl.
CPC ............ *G06F 30/394* (2020.01); *G06F 30/39* (2020.01); *G06F 30/392* (2020.01); *G06F 30/398* (2020.01); *G06F 30/3947* (2020.01); *G06F 30/3953* (2020.01)

(58) Field of Classification Search
CPC ...... G06F 30/394; G06F 30/39; G06F 30/392; G06F 30/3947; G06F 30/3953; G06F 30/398
See application file for complete search history.

(56) References Cited

U.S. PATENT DOCUMENTS 5,642,286 A * 6/1997 Yamada ................. G06F 30/394
716/139
5,856,925 A * 1/1999 Maeda .................... G06F 30/00
706/15

(Continued)

FOREIGN PATENT DOCUMENTS

CA 2897118 A1 * 7/2013 ......... H04L 41/0803
CN 1667647 A * 9/2005 ........... G06Q 10/087
(Continued)

*Primary Examiner* — Naum Levin
(74) *Attorney, Agent, or Firm* — Patterson + Sheridan, LLP

(57) ABSTRACT

The present disclosure relates to a chip design layout process. More specifically, the present disclosure is directed to an incremental routing-based pin assignment technique. One example method generally includes: performing routing and pin assignment for a chip design layout, one or more objects of the chip design layout being associated with a routing engine and a pin assignment engine stored in memory; detecting a change associated with the one or more objects of the chip design layout; updating, via one or more processors, at least one of the routing engine or the pin assignment engine stored in the memory in response to the detected change and based on the association between the one or more objects and the routing engine or pin assignment engine; and performing another routing and pin assignment based on the updated at least one of the routing engine or the pin assignment engine.

20 Claims, 7 Drawing Sheets

(51) Int. Cl.
*G06F 30/3947* (2020.01)
*G06F 30/398* (2020.01)

(56) References Cited

U.S. PATENT DOCUMENTS

| | | | | |
|---|---|---|---|---|
| 6,378,123 | B1* | 4/2002 | Dupenloup | G06F 30/30 716/104 |
| 6,618,834 | B2* | 9/2003 | Takeyama | G06F 30/30 977/839 |
| 7,003,754 | B2* | 2/2006 | Teig | G06F 30/394 716/134 |
| 7,017,043 | B1* | 3/2006 | Potkonjak | H04L 9/3247 713/181 |
| 7,086,017 | B1* | 8/2006 | Bloom | G06F 30/33 717/127 |
| 7,200,146 | B2* | 4/2007 | Khosravi | H04L 45/583 370/392 |
| 7,325,218 | B2* | 1/2008 | Katagiri | G06F 30/367 716/129 |
| 7,555,739 | B1* | 6/2009 | Ginetti | G06F 30/30 716/107 |
| 7,685,545 | B2* | 3/2010 | Chapman | G06F 30/398 716/136 |
| 7,707,536 | B2* | 4/2010 | Lin | G06F 30/394 716/135 |
| 7,793,250 | B2* | 9/2010 | Saini | G06F 30/18 345/689 |
| 8,739,103 | B1* | 5/2014 | Dutta | G06F 30/39 716/132 |
| 9,003,346 | B1* | 4/2015 | Dutta | G06F 30/392 716/126 |
| 9,330,222 | B2* | 5/2016 | White | G06F 30/394 |
| 9,576,091 | B1* | 2/2017 | Evans | G06F 30/30 |
| 9,798,840 | B1* | 10/2017 | Ginetti | G06F 30/20 |
| 10,204,028 | B2* | 2/2019 | Cai | G06F 8/433 |
| 10,460,069 | B1* | 10/2019 | Burdick | G06F 30/39 |
| 10,509,878 | B1* | 12/2019 | Ding | G06F 1/10 |
| 10,515,177 | B1* | 12/2019 | Ruehl | G06F 30/392 |
| 10,572,622 | B2* | 2/2020 | Bader | G06F 30/394 |
| 10,693,622 | B2* | 6/2020 | Gopalakrishnan | G06Q 10/06312 |
| 10,783,292 | B1* | 9/2020 | Clewes | G06F 30/392 |
| 10,885,257 | B1* | 1/2021 | Posser | G06F 30/398 |
| 10,963,615 | B1* | 3/2021 | Joshi | H03K 19/1776 |
| 11,030,375 | B2* | 6/2021 | Sriram | G06F 30/394 |
| 11,030,377 | B1* | 6/2021 | Chow | G06F 30/394 |
| 11,080,456 | B2* | 8/2021 | Kazda | G06F 30/394 |
| 11,449,660 | B1* | 9/2022 | Wu | G06F 30/392 |
| 11,537,369 | B2* | 12/2022 | Allan | G06F 40/30 |
| 2013/0311160 | A1* | 11/2013 | Cowie | H04W 40/20 703/13 |
| 2015/0067622 | A1* | 3/2015 | Goswami | G06F 30/398 716/106 |
| 2020/0050723 | A1* | 2/2020 | Matei | G06F 30/367 |
| 2021/0374322 | A1* | 12/2021 | Yun | G06F 30/398 |
| 2021/0390241 | A1* | 12/2021 | Yu | G06F 30/392 |
| 2021/0390244 | A1* | 12/2021 | Schaffer | G06F 30/323 |

FOREIGN PATENT DOCUMENTS

| | | | | |
|---|---|---|---|---|
| CN | 1667645 | B | * 5/2010 | G06Q 10/08 |
| CN | 102112988 | A | * 6/2011 | G06F 17/504 |
| CN | 102622468 | A | * 8/2012 | |
| CN | 108701258 | A | * 10/2018 | B60T 15/18 |
| JP | H04290166 | A | * 10/1992 | |
| JP | H04340174 | A | * 11/1992 | |
| JP | 2822677 | B2 | * 11/1998 | |
| JP | 3202845 | B2 | * 8/2001 | G06F 17/50 |
| TW | 541473 | B | * 7/2003 | |

* cited by examiner

400 →

```
┌─────────────────────────────────────────────────────────────┐
│  Perform routing and pin assignment for one or more nets in a │ ── 410
│  design layout of a chip design, one or more objects of the   │
│  design layout being associated with a routing engine and a   │
│  pin assignment engine stored in memory                       │
└─────────────────────────────────────────────────────────────┘
                              │
                              ▼
┌─────────────────────────────────────────────────────────────┐
│  Detect a change associated with the one or more objects of  │ ── 420
│  the design layout                                            │
└─────────────────────────────────────────────────────────────┘
                              │
                              ▼
┌─────────────────────────────────────────────────────────────┐
│  Update, via the one or more processors, at least one of the │ ── 430
│  routing engine or the pin assignment engine stored in the   │
│  memory in response to the detected change and based on the  │
│  association between the one or more objects of the design   │
│  layout with the routing engine or pin assignment engine     │
└─────────────────────────────────────────────────────────────┘
                              │
                              ▼
┌─────────────────────────────────────────────────────────────┐
│  Perform another routing and pin assignment based on the     │ ── 440
│  updated at least one of routing engine or pin assignment    │
│  engine.                                                      │
└─────────────────────────────────────────────────────────────┘
```

FIG. 4

INCREMENTAL ROUTING BASED PIN ASSIGNMENT

CROSS-REFERENCE TO RELATED APPLICATION

The present disclosure claims priority to U.S. Provisional Application No. 63/048,468 filed Jul. 6, 2020, which is hereby expressly incorporated by reference herein in its entirety as if fully set forth below and for all applicable purposes.

TECHNICAL FIELD

The present disclosure relates to a chip design layout process. More specifically, the present disclosure is directed to an incremental routing-based pin assignment technique.

BACKGROUND

In electronic design, wire routing is a step in the design of integrated circuits (ICs). After determining the location of components of an IC, the routing adds traces to properly connect the placed components while obeying design rules. A router may be provided with polygons associated with components of the IC. Each of these polygons are associated with a net, usually by name or number. The router creates geometries such that pins assigned to the same net are connected, no terminals assigned to different nets are connected, and design rules are obeyed.

As the size of IC designs increase (e.g., due to an increase in the number of devices in the IC design), it is increasingly difficult for design automation tools (e.g., electronic design automation (EDA)) to handle the IC designs having an increased size. This may be due to capacity limitations and increased difficulty in handling memory intensive calculations of the larger IC designs to meet timing or routing goals. A hierarchical design flow may be used to address such capacity issues since the IC design can be divided into smaller blocks and each block can be processed in a distributed way. In such a hierarchical flow, the pins on those blocks allow the design process to meet quality of results (QoR) metrics.

Global route-based pin assignment has been used in commercial EDA tools in this hierarchical flow to place the pins on the blocks. In global route-based pin assignment, a global routing engine routes the nets connecting to the blocks first. Then the pins are placed/assigned, via a pin assignment engine, based on the global routing results at the crossing locations between the global routings and block boundaries. In various instances, the pin assignment can be performed without global routing and only based on the nets' logical connections and block locations. However, the global route-based pin assignment provides improved pin assignment QoR as compared to none-global route-based techniques.

Due to the complexity and large design size, the runtime of global routing-based pin assignment is normally high. This issue is especially problematic when the pin assignment is performed incrementally. In many instances, the pin assignment is performed based on a list of net priorities. Since the runtime is high for global-routing based pin assignment, the overall time spent on the pin assignment stage may be time prohibitive, making the use of global-routing based pin assignment time and cost prohibitive.

SUMMARY

Certain aspects provide a method. The method generally includes: performing routing and pin assignment for a chip design layout, one or more objects of the chip design layout being associated with a routing database and a pin assignment database stored in memory; detecting a change associated with the one or more objects of the chip design layout; updating, via one or more processors, at least one of the routing database or the pin assignment database stored in the memory in response to the detected change and based on the association between the one or more objects and the routing database or pin assignment database; and performing another routing and pin assignment based on the updated at least one of the routing database or the pin assignment database.

Certain aspects provide an apparatus. The apparatus generally includes a memory; and one or more processors coupled to the memory, the one or more processors being configured to: perform routing and pin assignment for a chip design layout, one or more objects of the chip design layout being associated with a routing database and a pin assignment database stored in memory; detect a change associated with the one or more objects of the chip design layout; update at least one of the routing database or the pin assignment database stored in the memory in response to the detected change and based on the association between the one or more objects and the routing database or pin assignment database; and perform another routing and pin assignment based on the updated at least one of the routing database or the pin assignment database.

Certain aspects provide a non-transitory computer-readable medium having instruction stored thereon to cause one or more processors to: perform routing and pin assignment for a chip design layout, one or more objects of the chip design layout being associated with a routing engine and a pin assignment engine stored in memory; detect a change associated with the one or more objects of the chip design layout; update, via the one or more processors, at least one of the routing engine or the pin assignment engine stored in the memory in response to the detected change and based on the association between the one or more objects and the routing engine or pin assignment engine; and perform another routing and pin assignment based on the updated at least one of the routing engine or the pin assignment engine.

BRIEF DESCRIPTION OF THE DRAWINGS

The disclosure will be understood more fully from the detailed description given below and from the accompanying figures of aspects of the disclosure. The figures are used to provide knowledge and understanding of aspects of the disclosure and do not limit the scope of the disclosure to these specific aspects. Furthermore, the figures are not necessarily drawn to scale.

FIG. 4 illustrates example operations for chip design, in accordance with some aspects of the present disclosure.

DETAILED DESCRIPTION

Figure 1:
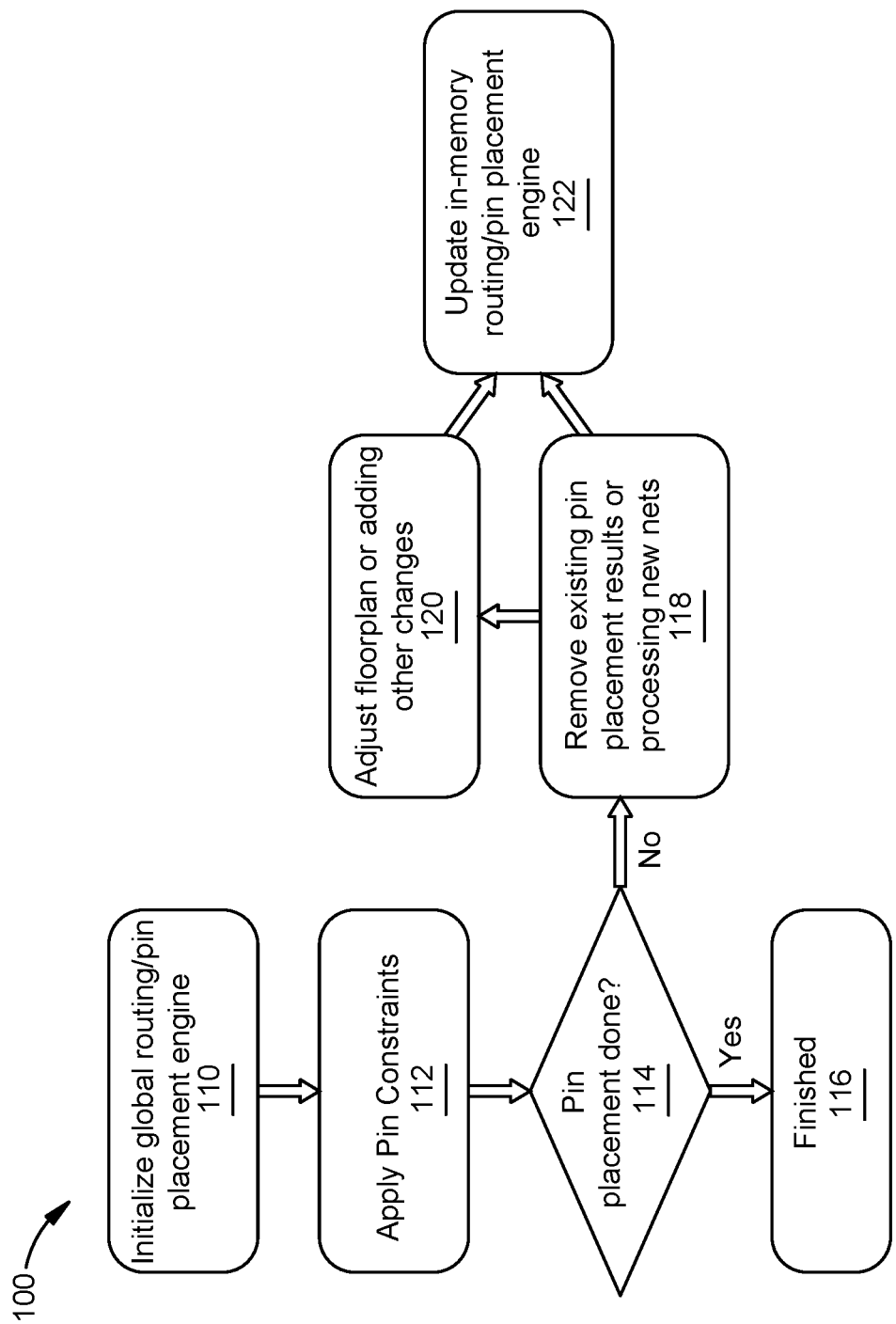
FIG. 1 illustrates example operations for generating a design layout in accordance with some aspects of the present disclosure.

Aspects of the present disclosure relate to techniques for incremental global-routing based pin assignment. When working with large chip design sizes, many chip design processes use a hierarchical design flow as many electronic design automation (EDA) tools are not able to handle large flat designs (e.g., having a million or more cell instances). In hierarchical design planning, an original flat design is re-grouped based on the register-transfer level (RTL) modules and child blocks are created for selected hierarchical levels to separate the top-level hierarchy from child-level hierarchies. After the child blocks are created via the hierarchical design planning (e.g., hierarchical abstraction), pin assignment is performed on the child blocks. The child blocks can be designed separately or in parallel to speed up the overall design process. The use of child blocks aids in avoiding capacity issues in EDA tools and reduces the total design time. In a hierarchical design flow process, pin assignment on child hierarchies/blocks is important since the pins on the child blocks serve as routing points between higher-level hierarchies and lower level hierarchies and/or between different blocks. In a hierarchical design flow process, net priority lists associated with clock nets, timing critical nets and/or bus nets are planned first and before other nets. In such a process, pin assignment is incrementally performed on selected nets. Such a pin assignment process has a runtime bottleneck mainly due to the slow initialization stage of the global routing-based pin assignment engine. The actual runtime spent on global routing and pin assignment depends on the provided net size and is faster than the initialization step in most cases. Some aspects provide techniques for avoiding this initialization process after every change to a chip design layout.

As chip design size increases (e.g., the number of devices in the design), the number of cells and nets in the design increase correspondingly. As is described, pin assignment on child block cells provide a way to separate top-level design from child-level designs. Further, pin assignment is incrementally performed based on net criticality. Pin assignment for more critical nets (for instance, clock net or bus nets) is performed before pin assignment is performed on nets with a lower criticality.

In various chip design instances, during the design process, an incremental pin assignment is performed along with interactively adjusting constraints and/or the floorplan of the chip design together. However, such a design process is time consuming and has a slow runtime. One of the main issues with the slow runtime is the large initialization runtime of the global route engine and the pin assignment engine that occurs each time pin assignment is performed. In various chip design instances, the initialization runtime may adversely affect the runtime of the chip design process as each time constraint and/or the floorplan are changed, pin assignment is also changed, which involves the initialization of the global route engine and the pin assignment engine. Certain aspects of the present disclosure provide techniques for avoiding reinitialization of the global route engine and the pin assignment engine after each design change, resulting in less processing time and processor utilization.

The following describes an improved incremental pin assignment process that increases the overall global routing-based pin assignment runtime speed without degrading the pin assignment quality of results (QoR).

FIG. 1 illustrates example operations 100 for incremental global route based pin placement flow in accordance with aspects of this disclosure. The global routing-based pin assignment process includes two engines. The first engine is the global routing engine (e.g., routing engine 690 stored in data storage device 618 of FIG. 6) and the second engine is a pin assignment engine (e.g., pin assignment engine 692 stored in data storage device 618 of FIG. 6). In other aspects, other engines may be used, or the global routing engine and the pin assignment engine may be combined into a single engine. When performing global routing-based pin placement on one or more nets, the global routing engine is called first to create the routings for one or more nets. After the global routing process has been completed, the block pin locations are derived by traversing the routing results. As the global routing engine is aware of the routing resources and congestion estimation of the routings between blocks within the nets, the pin locations derived from global routing results have better overall QoR as compared with normal fly-line or geometry-based pin assignment.

In other words, each time pin assignment is performed for a specific floor plan, global routing may be performed first. Thus, the router (e.g., processing device 602 of FIG. 6) initializes the routing engine and pin assignment engine by loading information from a design database (e.g., design database 694 stored in data storage device 618 of FIG. 6) in the routing engine and pin assignment engine. After the routing engine and pin assignment engine are initialized, the routing of the IC design is performed using the routing engine. The routing results are then passed to the pin assignment engine to be used for pin assignment. Upon any change to the floorplan (e.g., by the user), this process may be repeated, which can be time consuming. For example, a user may change the floor plan of the design, or adjust a pin constraint. For instance, the user may decide to use different layers for a pin by changing a pin layer constraint for the pin or changing the pin's location on the edge of a block. Typically, when a change is made, the global routing engine and the pin assignment engine are reinitialized. Initialization (or reinitialization) of the global routing engine and the pin assignment engine involves selection of data from a design database and generation of the global routing engine and the pin assignment engine using the selected data, such that the engines can be used for routing and pin assignment tasks. Without saving of the engines in memory such that the engines can be dynamically updated, the engines need to be reinitialized after each design change which involves seleccion and writing of all the data in the databases necessary to implement the global routing engine and the pin assignment engine, which can be time consuming and result in user dissatisfaction. Some aspects of the present disclosure are directed to techniques for updating the global routing engine and the pin assignment engine upon a detected change to the floorplan or pin assignment, avoiding a complete reinitialization of the global routing engine and the pin assignment engine to reduce processing time.

In the process flow of FIG. 1, at 110, the global routing engine and the pin assignment engine are initialized using a design database. The design database is used to store all information associated with a design layout. An engine (e.g., the global routing engine or pin assignment engine) generally refers to a database used to store a subset of the information in the design database for performing a specific routing or pin placement task. The global routing engine may also be referred to as a routing database (e.g., a global routing database) and the pin assignment engine may also be referred to as a pin assignment database. At 112, pin constraints are applied to the child blocks to complete the global routing process. At 114, a decision as to whether or not pin placement is done is made. If pin placement is finished (e.g., acceptable to a user), the global routing and pin placement flow is completed, at 116, for the chip design. If pin placement is not completed (e.g., changes to the pin placement are to be made), the existing pin placement results are removed and/or new nets are processed at 118. At 120, the floorplan is adjusted and/or other changes are added to the chip design in view of changes to the pin placement and/or inclusion of new nets.

At 122, an in-memory engine (e.g., a database associated with an engine, such as the routing engine or pin assignment engine) is updated based on the changes at 118 and 120. The in-memory engine tracks changes to pin placement and floorplan, and updates the global routing engine and pin assignment engine with the changes. In other words, instead of the global routing engine and pin assignment engine being reinitialized upon detection of the change to the floorplan or pin placement, the preinitialized engines are updated dynamically based on the change to the floorplan or pin placement.

Figure 2A:
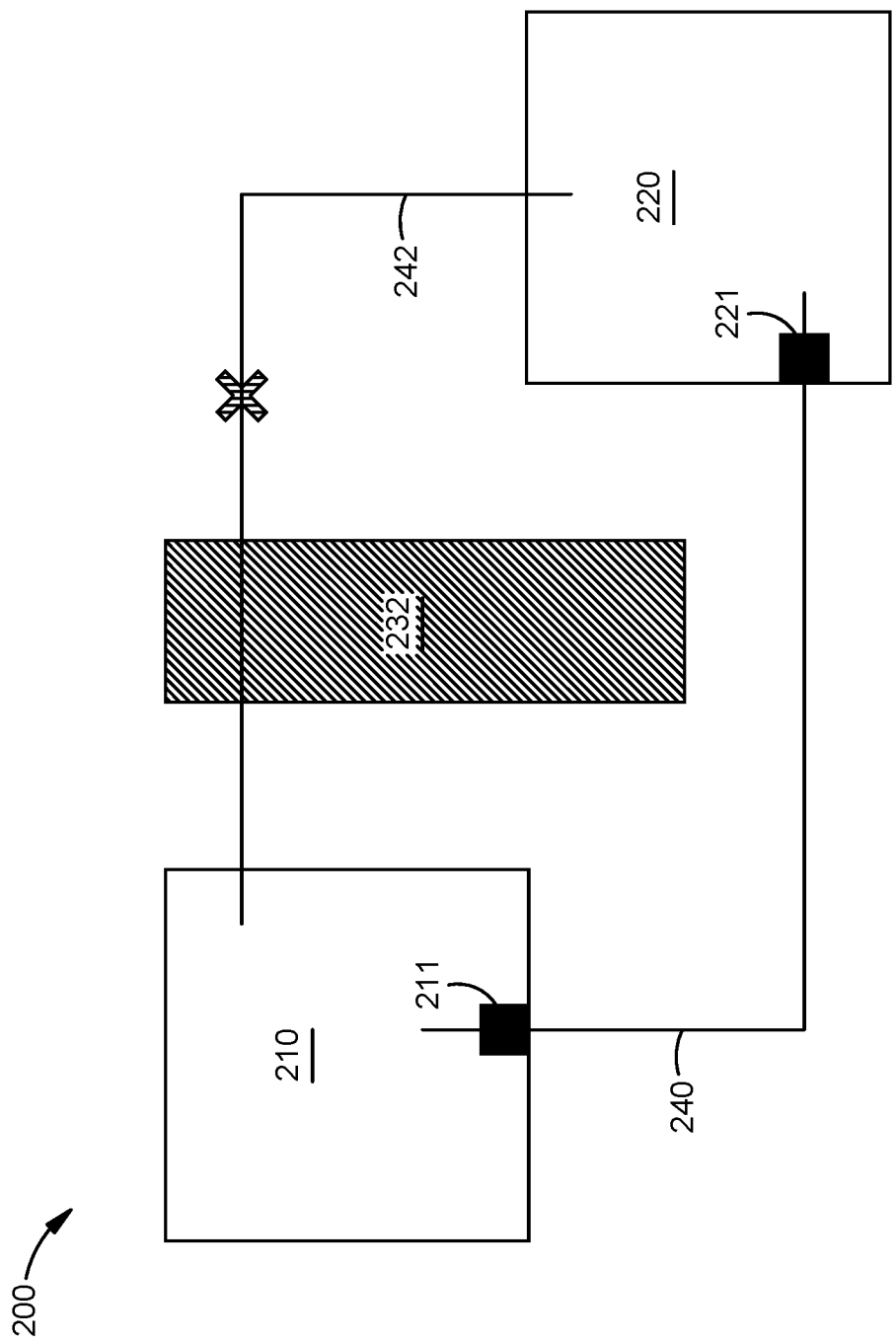
FIG. 2A illustrates a portion of a design layout in accordance with some aspects of the present disclosure.

FIG. 2A illustrates techniques for global routing for a chip design layout 200. As shown, the global routing process involves determining a routing 242 between one block 210 and another block 220. Once the routing is performed, pin assignment may be performed to place pins 211 and 221, as shown. The global routing process may avoid placing a routing between blocks 210 and 220 through a blockage, such as the blockage 232. The blockage 232 may represent an area with a high density of components through which routing should not be performed. Instead, the global routing process chooses the routing 240 with better QoR than possible routing 242 through blockage 232. The pins 211 and 221 are placed based on the routing results providing improved routability and overall routing QoR (e.g., wire length and/or congestion) for the selected nets as the blockage 232 is avoided.

After the pin assignment has been completed on a first net group, the next net group is processed if the QoR of the first net group is good (e.g., acceptable to a designer). If the QoR of a first net group is unacceptable, the floorplan is adjusted and/or the pin constraints are modified, and the pin assignment process is repeated to obtain better QoR. Such an iterative process is completed until all the pins are assigned. Upon each change to the design, a design database may be updated to reflect the change, and the global routing engine and pin assignment engine may be reinitialized based on the design database, which may be time consuming, as described. In some aspects, instead of reinitializing the engines, the engines are updated to save processing time.

Figure 2B:
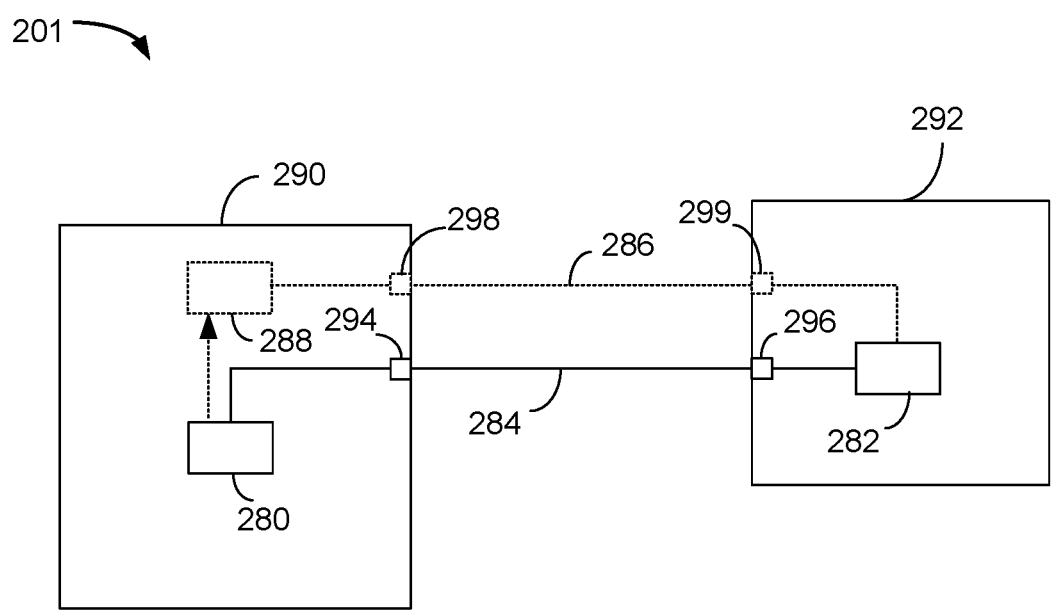
FIG. 2B illustrates a change to a design layout in accordance with some aspects of the present disclosure.

FIG. 2B illustrates a change to a chip design layout 201. As shown, a routing 284 may be performed from one object 280 to another object 282 in respective blocks 290, 292. After the routing, the pins 294, 296 may be placed. A user or another system or automated process may then change the design layout by moving an object 280 from one location to another location 288. In response, the design database may be updated, and based on the updated design database, the routing engine and pin assignment engine are updated accordingly. A new routing 286 may be performed using the updated routing engine, and pins 298, 299 may be placed using the updated pin assignment engine.

To perform global routing-based pin assignment with reduced process time, the global routing engine and pin assignment engine are maintained in memory to avoid reinitializing the global routing engine and the pin assignment engine each time a design change occurs (e.g., a change to pin assignment while performing an increment pin assignment process). For example, while performing the incremental pin assignment process, the floorplan and/or pin constraints are modified to achieve improved pin assignment QoR, as described. While performing the incremental pin assignment, the in-memory engines (e.g., global routing engine and pin assignment engine) are updated whenever any changes occur (e.g., floorplan changes or pin constraints changes).

In some aspects, an observer pattern process may be used to keep the data in the design database and the engines in sync. For example, a subject/observer design pattern is applied for the global routing-based pin assignment by performing an incremental mode for improved runtime. The subject/observer design pattern captures design data changes and/or pin constraints changes and updates the in-memory global routing engine and pin assignment engine accordingly.

In an observer pattern, an object (also referred to as a subject) maintains a list of its dependents, called observers, and notifies the observers of any state changes. Notification of the observers occurs automatically when changes are detected, in some aspects. The observers may be maintained in the global routing engine and pin assignment engine. Thus, a change of an object in the design database results in a change of the corresponding observers (e.g., dependents) in the global routing engine and pin assignment engine based on a list identifying these dependencies.

The design objects and pin constraint objects include routings, via shapes, pin (terminal) shapes, nets, instances, blockages, shapes of the blocks, wire tracks, and pin constraints. When there are changes to one or more objects (e.g., design objects or pin constraints objects), the corresponding registered global routing engine or pin assignment engine is updated by calling a corresponding interface update API. Each of the global routing and pin assignment engines may be updated using an associated interface update application programming interface (API). For example, a first interface update API is used to update the global routing engine, and the second interface update API is used to update the pin assignment engine. Accordingly, as changes are made, the design data associated with the global routing engine and the pin placement data associated with the pin constraint data are updated.

The design data and pin constraint data is maintained as being consistent between the database of design data and pin constraints and the global routing engine and pin assignment engine in the memory. In other words, the global routing engine may be registered with one or more of the objects in the design database, and the pin assignment engine may be registered with one or more of the objects in the design database. Accordingly, as changes to an object are detected within the design database, corresponding changes are made in the global routing engine and pin assignment engine for the registered objects.

As an example, an API may receive a notification that a particular change has been made to the design layout such as a change of an object in the design layout. In response, the API may retrieve the new information associated with the object, and update the routing engine and pin assignment engine with the new information for the object.

Figure 3:
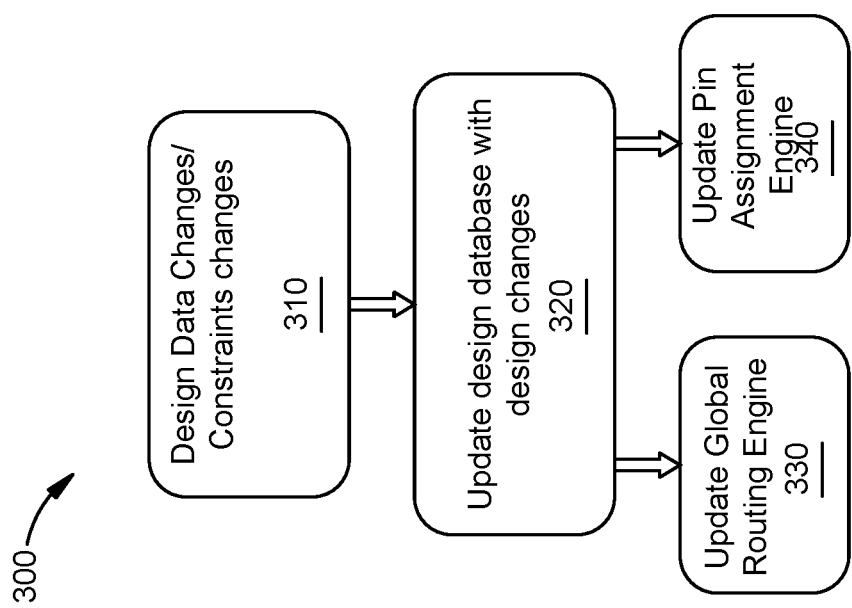
FIG. 3 illustrates example operations for updating a design layout in accordance with some aspects of the present disclosure.

FIG. 3 illustrates operations 300 for detecting design changes and updating a global routing database of a global routing engine and a pin assignment database of a pin assignment engine. At 310, changes to the design data and constraints are detected. In one aspect, one or more processors (e.g., the processing device 602 of FIG. 6) execute instructions to detect changes to design data. The design data is stored in a memory (e.g., the data storage device 618 of FIG. 6), also referred to as a design database. With reference to FIG. 1, the changes to design data may occur at 118 or 120. For example, a user's change in a cell location is detected, or a change to a pin constraint is detected. Upon the change to the design data and constraints, the design database is updated to reflect these changes at 320. For example, the new location of the cell is updated within the design database. In one aspect, one or more processors (e.g., the processing device 602 of FIG. 6) execute instructions to update the design database.

In some aspects of the present disclosure, the global routing engine and the pin assignment engine are updated to reflect the changes to the design database. The updated global routing engine and the pin assignment engine are then used to generate a chip design and store the design within memory. For example, at 330, the global routing engine is updated based on the detected change or changes to the design database. For example, instead of reinitializing the global routing engine, only a subset of data stored in the global routing engine may be updated. For example, an association between the global routing engine and the changed object within the design database may be detected, and the global routing engine is updated with the change. Thus, only the data in the global routing engine that is impacted by a particular change may be updated, instead of the entirely of the global routing engine being reinitialized. In some aspects, one or more processors (e.g., the processing device 602 of FIG. 6) execute instructions to update the global routing engine. Design objects within the design database associated with the global routing engine include an identifier that identifies the association between a design object with the global routing database. When a change to a design object is detected, the design object is analyzed to determine if there is an association between the design object and the global routing engine. If an association is detected, the corresponding design object in the global routing engine is updated.

Similarly, at 340, the pin assignment database is updated based on the detected change or changes to the design database. For example, an association between the pin assignment engine and the changed object within the design database is detected, and the pin assignment engine is updated with the change. Thus, only the data in the pin assignment engine that is impacted by a particular change may be updated, instead of the entirely of the pin assignment engine being reinitialized. In some aspects, one or more processors (e.g., the processing device 602 of FIG. 6) execute instructions to update the pin assignment engine. Design objects within the design database associated with the pin assignment engine include an identifier that identifies the association between a design object with the pin assignment engine. When a change to a design object is detected, the design object is analyzed to determine if there is an association between the design object and the pin assignment engine. If an association is detected, the corresponding design object in the pin assignment engine is updated.

The global routing engine and/or the pin assignment engine are updated without reinitializing the global routing engine and/or the pin assignment engine each time a change is made. Accordingly, the time spent initializing the global routing engine and/or pin assignment engine may be reduced, and the time associated with the design process is reduced.

FIG. 4 is a flow diagram illustrating example operations 400 for chip design, in accordance with certain aspects of the present disclosure. The operations 400 may be performed, for example, by one or more processors, such as the processing device 602 of FIG. 6.

The operations 400 begin, at 410, by the processing device performing routing and pin assignment for a chip design layout (e.g., chip design layout 200 or 201). One or more objects (e.g., object 280 or object 282) of the chip design layout may be associated with a routing engine and a pin assignment engine stored in memory (e.g., data storage device 618 of FIG. 6). The one or more objects may be stored in a design database (e.g., design database 694 stored in data storage device 618) configured to maintain information associated with the chip design layout.

Prior to performing the routing and pin assignment at 410, the processing device may initialize the routing engine and the pin assignment engine by storing information (e.g., from the design database) associated with the design layout in the memory. The routing and pin assignment, at 410, are performed using the initialized routing engine and pin assignment engine.

At 420, the processing device detects a change associated with the one or more objects of the chip design layout, such as a change of the design layout or a constraint associated with the chip design layout implemented by a user. For example, the change may include a change to a floorplan of the chip design layout (e.g., movement of an object (e.g., object 280) from on location in the layout to another location (e.g., location 288)) or a change to a pin constraint (e.g., a constraint associated with placement of pin 294 or 296) associated with the chip design layout. Constraints may include pin constrains (e.g., a constraint to a side or location) or net related constraints (e.g., minimum/maximum routing layers, special routing rule that applies to only specific nets . . . ). In some cases, a constraint may include a user creating routing blockages or routing corridors associated with certain nets.

At 430, the processing device updates the routing engine or the pin assignment engine (or both) stored in the memory in response to the detected change and based on the association between the one or more objects and the routing engine or pin assignment engine. In some aspects, the processing device may update the design database based on the detected change. The routing engine or the pin assignment engine may be updated based on the updated design database. As an example, updating the routing engine or the pin assignment engine may involve receiving, via an interface (e.g., an API), a notification of the change within the chip design layout, retrieving, from the design database, information associated with the change within the design layout, and updating the routing engine or the pin assignment engine using the retrieved information.

In some aspects, a list of dependencies between the one or more objects and data in the routing engine or pin assignment engine may be maintained. Updating the routing engine or the pin assignment engine may involve updating the data in the routing engine or pin assignment engine based on the list of dependencies.

At 440, the processing device performs another routing and pin assignment based on the updated routing engine or the updated pin assignment engine.

Figure 5:
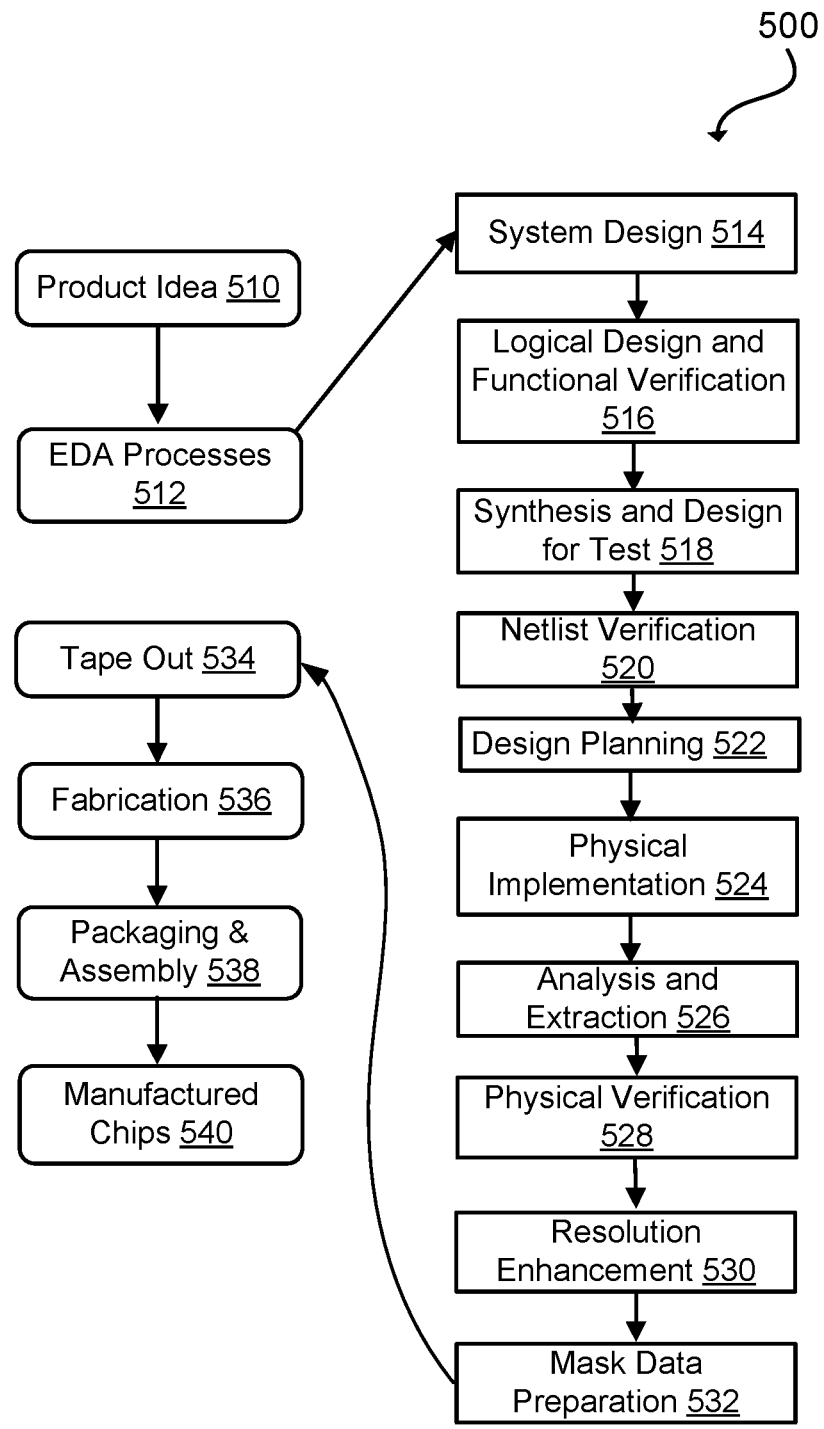
FIG. 5 depicts a flowchart of various processes used during the design and manufacture of an integrated circuit in accordance with some aspects of the present disclosure.

FIG. 5 illustrates an example set of processes 500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information which is transformed to create an article of manufacture that uses a set of EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 and packaging and assembly processes 538 are performed to produce the finished integrated circuit 540.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described by be enabled by EDA products (or tools).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some aspects, special systems of components referred to as 'emulators' or 'prototyping systems' are used to speed up the functional verification.

During synthesis and design for test 518, HDL code is transformed to a netlist. In some aspects, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing. In various aspects, the operations 300 is completed as part of design planning 522 of FIG. 5. For example, the design planning 522 may involve performing the operations 300 to reduce the amount of time spent during the design planning 522.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

A storage subsystem of a computer system (such as computer system 600 of FIG. 6) may be used to store the programs and data structures that are used by some or all of the EDA products described herein, and products used for development of cells for the library and for physical and logical design that use the library.

Figure 6:
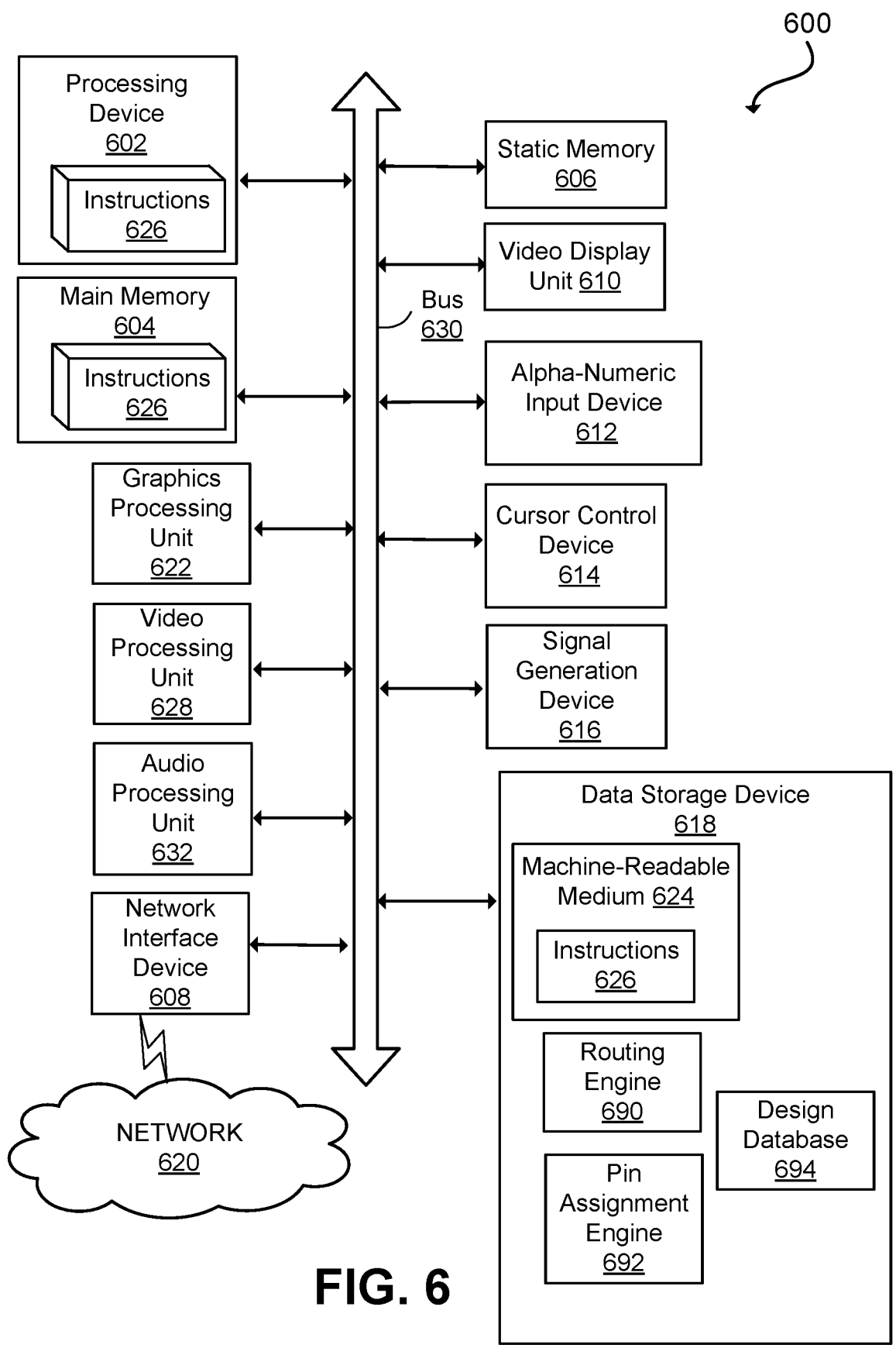
FIG. 6 depicts an abstract diagram of an example computer system in which aspects of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630. As shown, the data storage device 618 may include the routing engine 690, pin assignment engine 692, and design database 694. One or more of routing engine 690, pin assignment engine 692, and design database 694 may be stored in main memory 604, in some aspects.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
performing routing and pin assignment for a chip design layout, one or more objects of the chip design layout being associated with a routing database and a pin assignment database stored in memory, wherein the one or more objects are stored in a design database including one or more identifiers indicating the association between the one or more objects and the routing database or the pin assignment database;
detecting a change associated with the one or more objects of the chip design layout;
updating, via one or more processors, at least one of the routing database or the pin assignment database stored in the memory in response to the detected change and based on the association between the one or more objects and the routing database or pin assignment database stored in the design database, wherein the one or more objects include one or more pin constraint objects; and
performing another routing and pin assignment based on the updated at least one of the routing database or the pin assignment database.

2. The method of claim 1, wherein the design database is configured to maintain information associated with the chip design layout.

3. The method of claim 2, further comprising:
updating the design database based on the detected change with the chip design layout, wherein the at least one of the routing database or the pin assignment database is updated based on the updated design database.

4. The method of claim 2, wherein updating the at least one of the routing database or the pin assignment database comprises:
receiving, via an interface, a notification of the change within the chip design layout;
retrieving, from the design database, information associated with the change within the chip design layout; and
updating the at least one of the routing database or the pin assignment database using the retrieved information.

5. The method of claim 4, wherein the interface comprises an application programming interface (API).

6. The method of claim 1, further comprising:
maintaining a list of dependencies between the one or more objects and data in the routing database or pin assignment database, wherein updating the at least one of the routing database or the pin assignment database comprises updating the data in the at least one the routing database or pin assignment database based on the list of dependencies.

7. The method of claim 1, further comprising:
initializing, prior to the detection of the change, the routing database and the pin assignment database by storing information associated with the chip design layout in the memory, wherein the routing and pin assignment are performed using the initialized routing database and pin assignment database.

8. The method of claim 1, wherein the detected change comprises a change of the chip design layout or a constraint associated with the chip design layout implemented by a user.

9. An apparatus comprising:
a memory; and
one or more processors coupled to the memory, the one or more processors being configured to:
perform routing and pin assignment for a chip design layout, one or more objects of the chip design layout being associated with a routing database and a pin assignment database stored in memory, wherein the one or more objects are stored in a design database including one or more identifiers indicating the association between the one or more objects and the routing database or the pin assignment database;
detect a change associated with the one or more objects of the chip design layout;
update at least one of the routing database or the pin assignment database stored in the memory in response to the detected change and based on the association between the one or more objects and the routing database or pin assignment database stored in the design database, wherein the one or more objects include one or more pin constraint objects; and
perform another routing and pin assignment based on the updated at least one of the routing database or the pin assignment database.

10. The apparatus of claim 9, wherein the design database configured to maintain information associated with the chip design layout.

11. The apparatus of claim 10, wherein the one or more processors are further configured to update the design database based on detected change with the chip design layout, wherein the at least one of the routing database or the pin assignment database is updated based on the updated design database.

12. The apparatus of claim 10, wherein, in updating the at least one of the routing database or the pin assignment database, the one or more processors are configured to:
receive, via an interface, a notification of the change within the chip design layout;
retrieve, from the design database, information associated with the change within the chip design layout; and
update the at least one of the routing database or the pin assignment database using the retrieved information.

13. The apparatus of claim 12, wherein the interface comprises an application programming interface (API).

14. The apparatus of claim 9, wherein a list of dependencies between the one or more objects and data in the routing database or pin assignment database are maintained, wherein the one or more processors are configured to update the at least one of the routing database or the pin assignment database by updating the data in the at least one the routing database or pin assignment database based on the list of dependencies.

15. The apparatus of claim 9, wherein the one or more processors are further configured to initialize, prior to the detection of the change, the routing database and the pin assignment database by storing information associated with the chip design layout in the memory, wherein the one or more processors are configured to perform the routing and pin assignment using the initialized routing database and pin assignment database.

16. The apparatus of claim 9, wherein the detected change comprises a change of the chip design layout or a constraint associated with the chip design layout implemented by a user.

17. A non-transitory computer-readable medium having instruction stored thereon to cause one or more processors to:
   perform routing and pin assignment for a chip design layout, one or more objects of the chip design layout being associated with a routing engine and a pin assignment engine stored in memory, wherein the one or more objects are stored in a design database including one or more identifiers indicating the association between the one or more objects and the routing engine or the pin assignment engine;
   detect a change associated with the one or more objects of the chip design layout;
   update, via the one or more processors, at least one of the routing engine or the pin assignment engine stored in the memory in response to the detected change and based on the association between the one or more objects and the routing engine or pin assignment engine stored in the design database, wherein the one or more objects include one or more pin constraint objects; and
   perform another routing and pin assignment based on the updated at least one of the routing engine or the pin assignment engine.

18. The non-transitory computer-readable medium of claim 17, wherein the design database configured to maintain information associated with the chip design layout.

19. The non-transitory computer-readable medium of claim 18, wherein the instructions further cause the one or more processors to update the design database based on detected change with the chip design layout, wherein the at least one of the routing engine or the pin assignment engine is updated based on the updated design database.

20. The non-transitory computer-readable medium of claim 18, wherein causing the one or more processors to update the at least one of the routing engine or the pin assignment engine includes causing the one or more processors to:
   receive, via an interface, a notification of the change within the chip design layout;
   retrieve, from the design database, information associated with the change within the chip design layout; and
   update the at least one of the routing engine or the pin assignment engine using the retrieved information.

* * * * *